United States Patent
Finfter (10) Patent No.: US 9,705,485 B1
(45) Date of Patent: Jul. 11, 2017

(54) HIGH-RESOLUTION CURRENT AND METHOD FOR GENERATING A CURRENT

(71) Applicant: Marvell Israel (M.I.S.L) Ltd., Yokneam (IL)

(72) Inventor: Itai Finfter, Kfar-saba (IL)

(73) Assignee: MARVELL ISRAEL (M.I.S.L) LTD, Yokneam (IL)

( * ) Notice: Subject to any disclaimer, the term of this patent is extended or adjusted under 35 U.S.C. 154(b) by 0 days.

(21) Appl. No.: 15/208,071

(22) Filed: Jul. 12, 2016

Related U.S. Application Data (60) Provisional application No. 62/191,652, filed on Jul. 13, 2015.

(51) Int. Cl.
*H03K 7/08* (2006.01)

(52) U.S. Cl.
CPC ..................... *H03K 7/08* (2013.01)

(58) Field of Classification Search
USPC .......................................... 327/175
See application file for complete search history.

(56) References Cited

U.S. PATENT DOCUMENTS

| | | | |
|---|---|---|---|
| 6,594,309 B1* | 7/2003 | Botti | H03F 3/217 336/10 |
| 2004/0120395 A1* | 6/2004 | Orr | H02M 3/157 375/237 |
| 2008/0246523 A1* | 10/2008 | Murakami | H03K 7/08 327/175 |
| 2012/0161662 A1* | 6/2012 | Kim | H05B 33/0818 315/246 |

* cited by examiner

*Primary Examiner* — Lincoln Donovan
*Assistant Examiner* — Patrick Chen (57) ABSTRACT

A circuit for generating an output current and a method for generating an output current are provided. A voltage generator circuit is configured to generate at least two voltages. A digital circuit is configured to generate a pulse width modulation signal having a waveform characteristic that is controllable based on bits of configuration data received by the digital circuit. An averaging circuit is configured to receive the pulse width modulation signal and generate a bias voltage that comprises a weighted average of the at least two voltages. Weights of the at least two voltages are based on the waveform characteristic of the pulse width modulation signal. A voltage-controlled current source is configured to generate an output current based on the bias voltage.

20 Claims, 6 Drawing Sheets

| CONFIGURATION BITS (BINARY) | DECIMAL | DUTY CYCLE (PERCENT) | $V_{BIAS}(V)$ | $I_{OUT}(mA)$ |
|---|---|---|---|---|
| 00000000 | 0 | 0 | 0.5500 | 0.2500 |
| 00000001 | 1 | 0.39 | 0.5511 | 0.2512 |
| 00000010 | 2 | 0.78 | 0.5522 | 0.2523 |
| 00000011 | 3 | 1.18 | 0.5533 | 0.2535 |
| 00000100 | 4 | 1.57 | 0.5544 | 0.2547 |
| ... | ... | ... | ... | ... |
| 11111111 | 255 | 100 | 0.8300 | 0.5500 |

.# HIGH-RESOLUTION CURRENT AND METHOD FOR GENERATING A CURRENT

CROSS-REFERENCE TO RELATED APPLICATIONS

This application claims priority to U.S. Provisional Patent Application No. 62/191,652, filed Jul. 13, 2015, entitled "Method of a Digital-to-Analog Converter for Generating a High-Resolution Current Source," which is incorporated herein by reference in its entirety.

FIELD

The technology described herein relates generally to electrical circuits and more particularly to high-resolution current sources and methods of generating a current.

BACKGROUND

A number of different types of current sources have been developed to deliver electric currents. Such current sources include, for example, independent current sources that are configured to deliver a constant current and dependent current sources that are configured to deliver a current that is proportional to some other voltage or current in a circuit. Current sources that deliver an amount of current that is controllable at a relatively high degree of resolution are desirable.

The description above is presented as a general overview of related art in this field and should not be construed as an admission that any of the information it contains constitutes prior art against the present patent application.

SUMMARY

Examples of a circuit for generating an output current and a method for generating an output current are provided. An example circuit for generating an output current includes a voltage generator circuit configured to generate at least two voltages. A digital circuit is configured to generate a pulse width modulation signal having a waveform characteristic that is controllable based on bits of configuration data received by the digital circuit. An averaging circuit is configured to (i) receive the pulse width modulation signal, and (ii) generate a bias voltage that comprises a weighted average of the at least two voltages. Weights of the at least two voltages are based on the waveform characteristic of the pulse width modulation signal. A voltage-controlled current source is configured to generate an output current based on the bias voltage.

Another example circuit for generating an output current includes a voltage generator circuit configured to generate at least two voltages. A pulse width modulation circuit is configured to generate a pulse width modulation signal having a waveform characteristic that is controllable based on bits of configuration data. An averaging circuit is configured to generate a bias voltage that comprises a weighted average of the at least two voltages. Weights of the at least two voltages are based on the waveform characteristic of the pulse width modulation signal. A current source is configured to generate an output current based on the bias voltage.

In an example method for generating an output current, at least two voltages are generated. A pulse width modulation signal having a waveform characteristic that is controllable based on bits of configuration data is generated. A bias voltage that comprises a weighted average of the at least two voltages is generated, where weights of the at least two voltages are based on the waveform characteristic of the pulse width modulation signal. An output current based on the bias voltage is generated using a voltage-controlled current source.

DETAILED DESCRIPTION

Figure 1A:
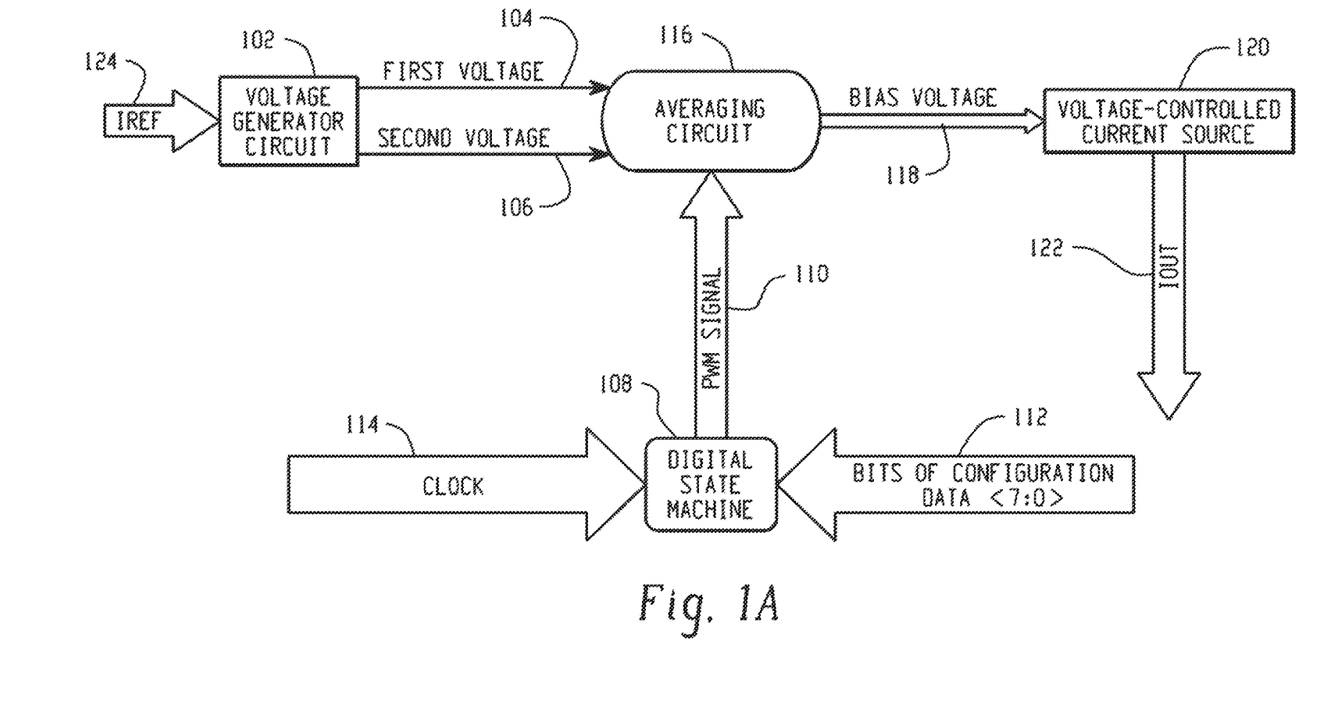
FIG. 1A is a block diagram of an example circuit for generating an output current, according to an embodiment.

FIG. 1A is a block diagram of an example circuit for generating an output current 122, according to an embodiment. The example circuit enables the output current 122 to be controlled at a relatively high degree of resolution through the use of a digital circuit 108, such as a digital state machine in an embodiment. As described in detail below, the digital circuit 108 receives bits of configuration data 112 and generates a pulse width modulation signal 110 with a duty cycle that is based on the bits of configuration data 112. The digital circuit 108 enables the duty cycle to be controlled in a precise, high-resolution manner based on the bits of configuration data 112. By controlling the duty cycle of the pulse width modulation signal 110 in this manner, the output current 122 can likewise be controlled in a precise, high-resolution manner, as described below.

Figure 2:
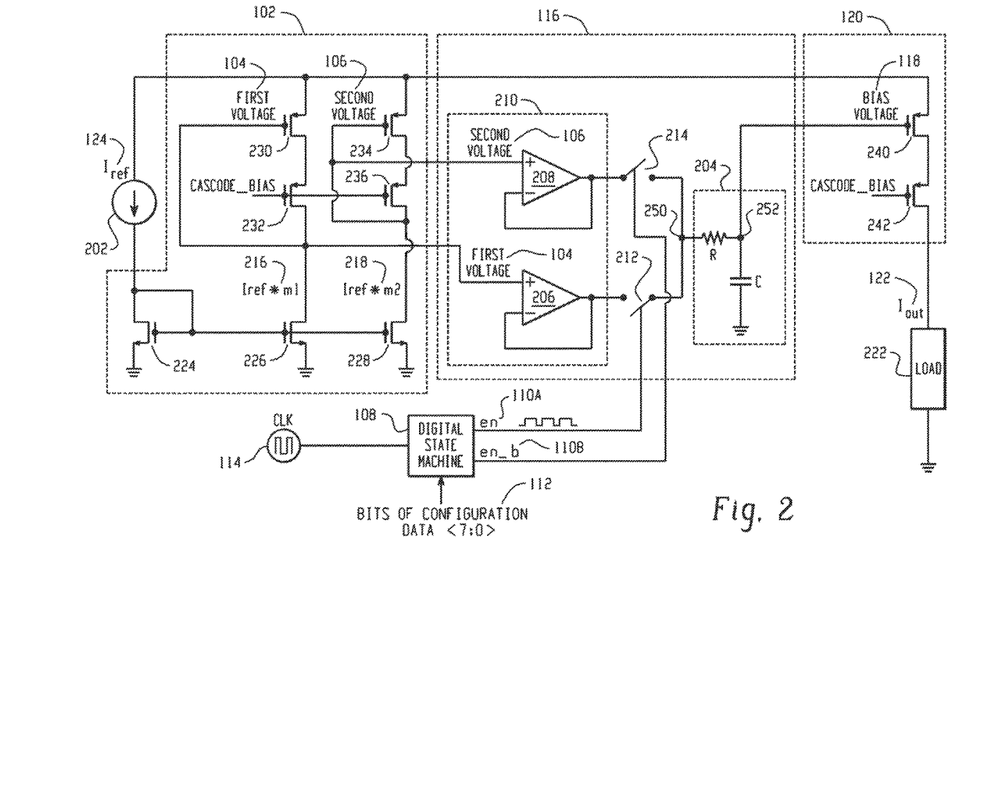
FIG. 2 is a circuit diagram depicting one embodiment of the example circuit of FIG. 1A, according to an embodiment.

The example circuit of FIG. 1A includes a voltage generator circuit 102 that is configured to generate at least first and second voltages 104, 106. As shown in the figure, the voltage generator circuit 102 receives a reference current 124. In examples, the reference current 124 is a constant current generated by a constant current source, and the voltage generator circuit 102 uses the constant current in generating the first and second voltages 104, 106. As referred to herein, a "constant current" is a current (e.g., a Direct Current (DC)) with a current level that does not change with time (or that is approximately unchanging with time). As illustrated in FIG. 2 and described in further detail below, in examples, the voltage generator circuit 102 includes transistors connected to form multiple current mirrors. The current mirrors mirror the reference current 124 to first and second branches, and voltages at nodes of the respective first and second branches comprise the first and second voltages 104, 106, in examples.

A digital circuit 108, such as a digital state machine, is configured to generate a pulse width modulation signal 110 having a duty cycle. Pulse width modulation signals are digital signals that can take on two different voltage levels, high and low (e.g., 5V and 0V, respectively), and the duty cycle represents a percentage of time that the signal is high over a period of time. In the example circuit of FIG. 1A, the duty cycle of the pulse width modulation signal 110 is controllable based on the bits of configuration data 112 received by the digital circuit 108. In the example of this figure, the digital circuit 108 is configured to receive eight bits of configuration data, labeled bits <7:0>. The eight bits of configuration data 112 can represent 256 different numbers. For example, if each of the eight bits of configuration data 112 has a value of "0," then the digital circuit 108 receives binary data "00000000," and conversely, if each of the eight bits of configuration data 112 has a value of "1," then the digital circuit 108 receives binary data "11111111." Different combinations of 0's and 1's in the bits of configuration data 112 enable the aforementioned 256 different numbers. In examples, the digital circuit 108 comprises a portion of a device or component having an interface for receiving the bits of configuration data 112 from another device or component. Further, in examples, the digital circuit 108 comprises a storage device (e.g., a memory, registers, etc.) for storing the received bits of configuration data 112.

As noted above, the digital circuit 108 controls the duty cycle of the pulse width modulation signal 110 based on the bits of configuration data 112. In examples, the controlling of the duty cycle is further based on a digital clock signal 114 received by the digital circuit 108. Specifically, in examples, the digital circuit 108 is responsive to edges in the received digital clock signal 114. As described in further detail below with reference to FIG. 3A, the digital circuit 108 is configured to maintain a count value, with the count value being incremented in response to edges (e.g., rising edges, falling edges) of the clock signal 114. The digital circuit 108 causes the pulse width modulation signal 110 to have (i) a first logic level (e.g., a "high" logic level) over a first range of count values, and (ii) a second logic level (e.g., a "low" logic level) over a second range of count values, with the first and second ranges being based on the bits of configuration data 112, in embodiments. This is explained in further detail below.

In some embodiments, the digital circuit 108 is a digital state machine known to those of ordinary skill in the art. The digital state machine is configured to implement the functionality described above (e.g., maintaining a count value, incrementing the count value in response to edges in the received digital clock signal 114, controlling the duty cycle of the pulse width modulation signal 110 based on the bits of configuration data 112, etc.). The circuit 108 is said to be "digital" because it (i) generates the digital pulse width modulation signal 110 having the two, discrete voltage levels, (ii) is responsive to edges of the received digital clock signal 114, and (iii) operates based on the received configuration data 112, which is digital data encoded as bits. The digital nature of the circuit 108 is in contrast to other portions of the example circuit of FIG. 1A, which include analog components (e.g., resistors, differential amplifiers, capacitors, transistors, etc.) that implement analog circuits. Such analog components and analog circuits are described below.

As detailed herein, in accordance with techniques described in the present disclosure, the use of the digital circuit 108 enables the output current 122 to be controlled at a relatively high degree of resolution. The controlling of the output current 122 at the relatively high degree of resolution is explained in further detail below with reference to FIG. 1C. Specifically, the digital circuit 108 enables the duty cycle of the pulse width modulation signal 110 to be controlled in a precise, high-resolution manner based on the bits of configuration data 112. By controlling the duty cycle of the pulse width modulation signal 110 in this manner, the output current 122 can likewise be controlled in a precise, high-resolution manner, as described below.

The block diagram of FIG. 1A further includes an averaging circuit 116. As shown in the figure, the averaging circuit 116 is configured to receive the pulse width modulation signal 110 and the first and second voltages 104, 106. The averaging circuit 116 is further configured to generate a bias voltage 118 that comprises a weighted average of the first and second voltages 104, 106, where weights of the respective first and second voltages 104, 106 are based on the duty cycle of the pulse width modulation signal 110. Thus, for example, if the first voltage 104 is equal to 0.55 V and the second voltage 106 is equal to 0.83 V, and the duty cycle is 50%, then the bias voltage 118 is equal to 0.69 V. If the duty cycle is 0%, then the bias voltage 118 is equal to 0.55 V, and if the duty cycle is 100%, then the bias voltage 118 is equal to 0.83 V, in this example. By controlling the duty cycle of the pulse width modulation signal 110, the bias voltage 118 can be set to any voltage between 0.55 V and 0.83 V, in this example.

In embodiments, the bias voltage 118 generated by the averaging circuit 116 is represented by the following:

$$V\_bias = (DC)(V2) + (1-DC)(V1), \quad \text{(Equation 1)}$$

where V_bias is the bias voltage 118, V2 is the second voltage 106, V1 is the first voltage 104, and DC represents the duty cycle of the pulse width modulation signal 110, having a value between 0 (i.e., 0% duty cycle) and 1.0 (i.e., 100% duty cycle). In Equation 1, the terms (1−DC) and (DC) are weights for the respective first and second voltage 104, 106.

As shown in FIG. 1A, the bias voltage 118 is output from the averaging circuit 116 to a voltage-controlled current source 120. The voltage-controlled current source 120 generates the output current 122 based on the received bias voltage 118. In examples, the voltage-controlled current source 120 comprises a metal-oxide-semiconductor field-effect transistor (MOSFET) that receives the bias voltage 118 at a gate terminal, and the output current 122 is a drain current ($I_d$) of the MOSFET. The drain current is a current that flows between source and drain terminals of the MOSFET, in examples. The output current 122 has a generally linear relationship with the bias voltage 118 for bias voltages between the first and second voltages 104, 106. The relationship between the output current 122 and the bias voltage 118 is referred to herein as being "generally" linear to denote the fact that in some instances, the relationship may be close to linear, but not precisely linear. To illustrate the linear relationship between the output current 122 and the bias voltage 118, reference is made to FIG. 1B. This figure is a graph depicting an example current-voltage relationship of the voltage-controlled current source 120, according to an embodiment.

Figure 1B:
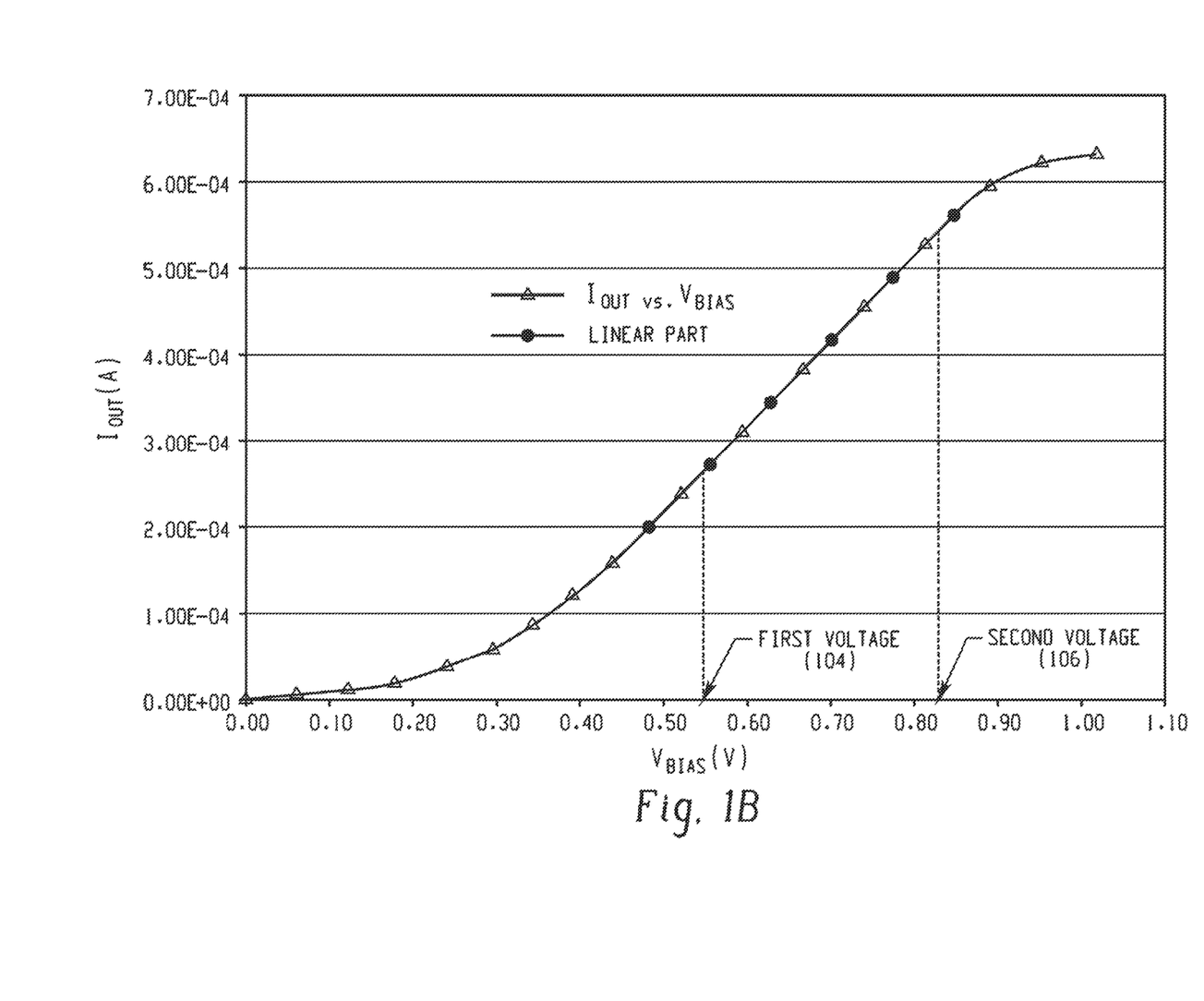
FIG. 1B is a graph depicting a current-voltage relationship of an example voltage-controlled current source, according to an embodiment.

In FIG. 1B, a y-axis represents an output current generated by the voltage-controlled current source 120, and an x-axis represents a bias voltage received by the current source 120. In embodiments where the voltage-controlled current source 120 comprises a MOSFET, the output current shown via the y-axis comprises a drain current ($I_d$) of the MOSFET (e.g., a current flow between source and drain terminals of the MOSFET), and the bias voltage shown via the x-axis is received at a gate terminal of the MOSFET. In the embodiments where the voltage-controlled current source 120 comprises the MOSFET, the graph of FIG. 1B depicts a drain current versus Vgs behavior of the MOSFET, in examples.

As shown in FIG. 1B, the current-voltage relationship of the voltage-controlled current source 120 has a linear region, over which there is a generally linear relationship between the output current and the received bias voltage. The linear region of the curve is marked by circles in FIG. 1B, and as can be seen in the figure, the first and second voltages 104, 106 are within the linear region of the curve. The bias voltage 118 generated by the averaging circuit 116 is also within the linear region of the curve, because the bias voltage 118 comprises a weighted average of the first and second voltages 104, 106, such that (first voltage 104)≤(bias voltage 118)≤(second voltage 106), in this example. If the bias voltage 118 (e.g., Vgs) of the voltage-controlled current source 120 is too low or too high, the relationship is not linear anymore, as can be seen in FIG. 1B. This can happen if the device dimensions are not chosen to properly accommodate the currents designed to flow through them. When older manufacturing processes (e.g., manufacturing processes that are not "deep submicron technologies") are used, the linear region is smaller.

As described above, in generating the bias voltage 118 that is a weighted average of the first and second voltages 104, 106 using the averaging circuit 116, weights of the first and second voltages 104, 106 are controlled based on the duty cycle of the pulse width modulation signal 110, with the duty cycle being set based on the bits of configuration data 112. Accordingly, by controlling the bias voltage 118 within the linear region of the curve based on the bits of configuration data 112, the output current 122 can likewise be controlled within the linear region of the curve. In this manner, by generating the first and second voltages 104, 106 that are within the linear region and controlling the bias voltage 118 based on the bits of configuration data 112, the output current 122 can be controlled across a range of output currents within the linear region of the curve.

Figure 1C:
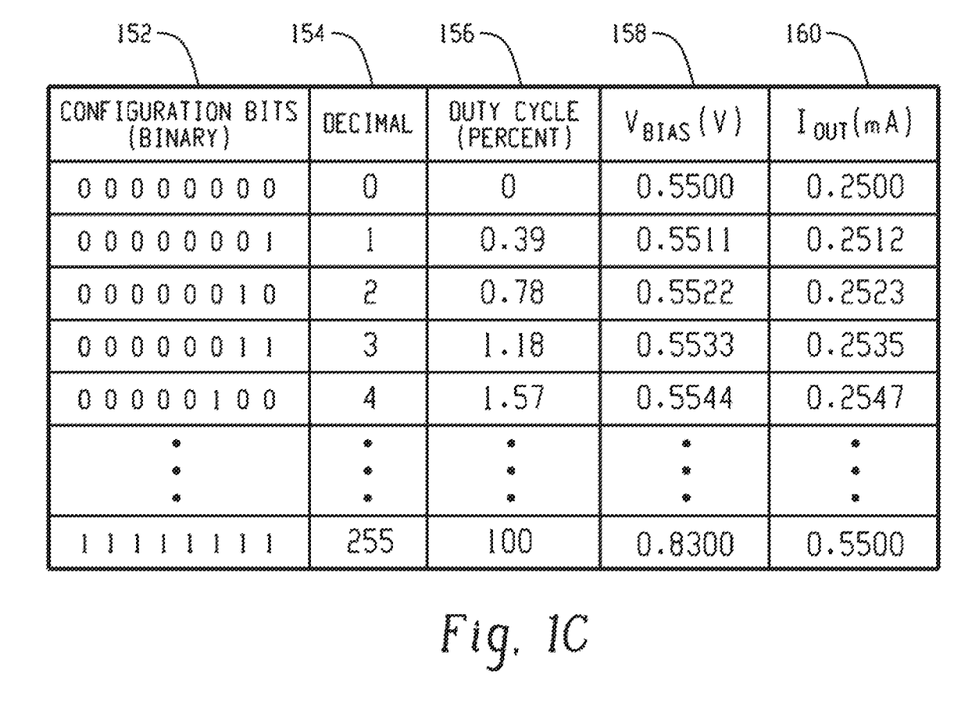
FIG. 1C is a table depicting example output currents that can be generated by the circuit of FIG. 1A, according to an embodiment.

The digital circuit 108 of FIG. 1A enables the output current 122 to be controlled precisely and with a high degree of resolution. The precise, high-resolution control of the output current 122 is enabled, at least in part, by the use of the digital circuit 108. To illustrate the high-resolution control of the output current 122 enabled by the digital circuit 108, reference is made to FIG. 1C. This figure is a table depicting example output currents that can be generated by the circuit of FIG. 1A, according to an embodiment. As described above, in the example of FIG. 1A, the bits of configuration data 112 comprise eight bits of configuration data, labeled bits <7:0>. The eight bits of configuration data 112 can represent 256 different numbers, depending on the combination of 0's and 1's making up the data 112. In FIG. 1C, a first column 152 illustrates example values of the eight configuration bits. Each of these example values represents a binary number, with the binary numbers ranging from "00000000" to "11111111." These binary numbers can be represented in decimal form, as shown in a second column 154 of FIG. 1C. In decimal form, the eight bits of configuration data 112 can represent values ranging from 0 to 255, as shown in the figure.

As described above, the digital circuit 108 is configured to generate the pulse width modulation signal 110 having a duty cycle that is controllable based on the bits of configuration data 112. Thus, in examples, the digital circuit 108 processes the received bits of configuration data 112 to set the duty cycle of the pulse width modulation signal 110. The eight bits of configuration data 112 can represent 256 different numbers, such that the duty cycle of the pulse width modulation signal 110 can likewise be set at 256 different values between a 0% duty cycle and a 100% duty cycle. This is illustrated in a third column 156 of the table of FIG. 1C, which shows duty cycle values corresponding to respective values of the configuration bits 112. For instance, for configuration bits having a binary value of "0000000," a corresponding duty cycle is 0%, in this example. Further, for instance, for configuration bits having a binary value of "00000001," a corresponding duty cycle is 0.39%, in this example.

As illustrated in the example of FIG. 1C, because the duty cycle of the pulse width modulation signal 110 can be set at 256 different values between 0-100% duty cycle, the duty cycle is controllable at a relatively high degree of resolution. For example, as shown in the figure, example duty cycles that may be achieved based on the eight bits of configuration data 112 include 0%, 0.39%, 0.78%, 1.18%, and 1.57%. Although the example of FIGS. 1A and 1C utilizes eight bits of configuration data <7:0>, in other examples, a different number of bits of configuration data are utilized. Specifically, in other examples, a higher number of bits of configuration data are utilized to enable the duty cycle to be controlled at even higher degrees of resolution. For example, if twelve bits of configuration data are utilized, the duty cycle of the pulse width modulation signal 110 can be set at 4,096 values between a 0% duty cycle and a 100% duty cycle.

By controlling the duty cycle of the pulse width modulation signal 110 to be at a relatively high degree of resolution, the bias voltage 118 and output current 120 can likewise be controlled at relatively high degrees of resolution. To illustrate this, reference is again made to FIG. 1C. In this figure, a fourth column 158 of the table represents the bias voltage 118 generated by the averaging circuit 116. As described above, the averaging circuit 116 generates the bias voltage 118 that is a weighted average of the first and second voltages 104, 106, with the weights of the respective first and second voltages 104, 106 being based on the duty cycle of the pulse width modulation signal 110. In the example of FIG. 1B, the first voltage 104 is equal to 0.55 V, and the second voltage 106 is equal to 0.83 V. Thus, in accordance with Equation 1 shown above, for a duty cycle of 0%, the bias voltage 118 is equal to the first voltage 104 (i.e., 0.55 V, in this example), and for a duty cycle of 100%, the bias voltage 118 is equal to the second voltage 106 (i.e., 0.83 V, in this example). These values are shown in the fourth column 158 of FIG. 1C. The fourth column 158 also shows bias voltages for other duty cycles.

Because the duty cycle of the pulse width modulation signal 110 can be set at 256 different values between 0-100% duty cycle, in an embodiment, the bias voltage 118 can likewise be set at 256 different values between the first voltage 104 (i.e., 0.55 V, in this example) and the second voltage 106 (i.e., 0.83 V, in this example). Thus, according to the techniques of the present disclosure, the bias voltage 118 is controllable at a relatively high degree of resolution. For example, as shown in FIG. 1C, example bias voltages 118 include 0.55 V, 0.5511 V, 0.5522 V, 0.5533 V, and 0.5544 V. In other examples where more than eight bits of configuration data 112 are utilized, the bias voltage 118 is controllable at even higher degrees of resolution.

In FIG. 1C, a fifth column 160 represents output current 122 generated by the voltage-controlled current source 120. As described above, the voltage-controlled current source 120 generates the output current 122 based on the bias voltage 118. The output current 122 has a generally linear relationship with the bias voltage 118 for bias voltages between the first and second voltages 104, 106. As shown in the example of FIG. 1B, when the bias voltage 118 is equal to the first voltage 104 (i.e., when the duty cycle of the pulse width modulation signal 110 is equal to 0%), the output current 122 is equal to 0.25 mA, and when the bias voltage 118 is equal to the second voltage 106 (i.e., when the duty cycle of the pulse width modulation signal 110 is equal to 100%), the output current 122 is equal to 0.55 mA. The fifth column 160 of FIG. 1C shows these values of the output current 122 for the respective bias voltages.

Because the bias voltage 118 can be set at 256 different values between the first voltage 104 and the second voltage 106, the output current 122 can likewise be set at 256 different values between 0.25 mA and 0.55 mA, in this example. Thus, according to the techniques of the present disclosure, the output current 122 is controllable at a relatively high degree of resolution. For example, as shown in FIG. 1C, example output currents 122 include 0.25 mA, 0.2512 mA, 0.2523 mA, 0.2535 mA, and 0.2547 mA. It is thus noted that under the approaches of the instant disclosure, the digital circuit 108 generates the pulse width modulation signal 110 having the duty cycle that is controllable at a relatively high degree of resolution based on the bits of configuration data 112. By controlling the duty cycle at the relatively high degree of resolution, the bias voltage 118 and the output current 122 are likewise controllable at relatively high degrees of resolution. Further, as noted above, using a higher number of bits of configuration data 112 enables the duty cycle to be controlled at even higher degrees of resolution, such that the bias voltage 118 and the output current 122 can likewise be controlled at higher degrees of resolution.

FIG. 2 is a circuit diagram depicting one embodiment of the example circuit described above with reference to FIG. 1A, according to an embodiment. The circuit of FIG. 2 includes a constant current source 202 (e.g., an independent current source) configured to generate a reference current (Iref) 124 that is a constant current, in examples. The voltage generator circuit 102 comprises a first transistor 224 that is configured to draw the reference current 124 from the constant current source 202. In the example of FIG. 2, the first transistor 224 is an NMOS transistor, as illustrated in the figure. The voltage generator circuit 102 further includes a second transistor 226 that is configured to draw a first current 216 equal to the reference current 124 multiplied by a first multiplicative factor m1 (i.e., such that the first current 216 is equal to Iref*m1, as illustrated in the figure). In the example of FIG. 2, the second transistor 226 is an NMOS transistor, as illustrated in the figure.

The first and second transistors 224, 226 are connected to form a first current mirror, as illustrated in the circuit diagram, and the multiplicative factor m1 comprises a "mirror ratio" of the first current mirror. The mirror ratio is a ratio between the reference current 124 and the first current 216. In the example of FIG. 2, the mirror ratio is based on physical dimensions of the first and second transistors 224, 226. Such physical dimensions include transistor width, channel length, a ratio of the transistor width and channel length, etc. For instance, if the second transistor 226 has a width that is double that of the first transistor 224, then the mirror ratio (i.e., the multiplicative factor m1) is equal to 2, in examples. Likewise, in other examples, if the second transistor 226 has a length that is half that of the first transistor 224, then the mirror ratio is equal to 2.

The voltage generator circuit 102 further comprises a third transistor 228 configured to draw a second current 218 equal to the reference current 124 multiplied by a second multiplicative factor m2 (i.e., such that the second current 218 is equal to Iref*m2, as illustrated in the figure). The second multiplicative factor m2 is different from the first multiplicative factor m1, such that the first and second currents 216, 218 are not equal to each other. In the example of FIG. 2, the third transistor 228 is an NMOS transistor, as illustrated in the figure. The first and third transistors 224, 228 are connected to form a second current mirror, as illustrated in the figure, and the multiplicative factor m2 comprises a mirror ratio of the second current mirror. The mirror ratio of the second current mirror is based on physical dimensions (e.g., transistor width, channel length, etc.) of the first and third transistors 224, 228.

The voltage generator circuit 102 is configured to generate at least the first and second voltages 104, 106, as described above with reference to FIG. 1A. In the example of FIG. 2, the first voltage 104 is based on the first current 216, and the second voltage 106 is based on the second current 218. Specifically, as shown in FIG. 2, the voltage generator circuit 102 includes a fourth transistor 230 configured to draw the first current 216. A voltage at a gate terminal of the fourth transistor 230 is the first voltage 104, as illustrated in the figure. It is noted that the voltage at the gate terminal of the fourth transistor 230 is based on the first current 216 drawn by the transistor 230, such that the first voltage 104 is based on the first current 216, as noted above.

The voltage generator circuit 102 further includes a fifth transistor 234 configured to draw the second current 218. A voltage at a gate terminal of the fifth transistor 234 is the second voltage 106, as illustrated in the figure. The voltage at the gate terminal of the fifth transistor 234 is based on the second current 218 drawn by the transistor 234, such that the second voltage 106 is based on the second current 218, as noted above. In the example circuit of FIG. 2, the fourth and fifth transistors 230, 234 are PMOS transistors, as shown in the figure. Further, PMOS transistors 232, 236 are coupled to the respective fourth and fifth transistors 230, 234. As shown in the figure, the transistors 232, 236 both receive a "cascode bias" at their respective gate terminals. The "cascode bias" is a voltage that dictates the gate voltage of the cascode device. The purpose of the cascode device is to increase the output impedance of the current source, i.e., minimize the effect of a variation of output node (e.g., nodes 216 and 218, on the current value sourced by transistors 230 and 234, respectively).

The voltage generator circuit 102 is configured such that the first and second voltages 104, 106 at the gate terminals of the respective fourth and fifth transistors 230, 234 are within a linear region of the voltage-controlled current source 120 used in generating the output current 122. For example, as described above with reference to FIGS. 1A and 1B, the voltage-controlled current source 120 has a linear region over which there is a generally linear relationship between the output current and the received bias voltage. This linear region is marked by circles in the example of FIG. 1B. By ensuring that the first and second voltages 104, 106 are within the linear region of the voltage-controlled current source 120, the circuit of FIG. 2 generates the output current 122 that is a weighted average of the first and second currents 216, 218, with weights of the respective first and second currents 216, 218 being set based on the duty cycle of the pulse width modulation signal 110. The generation of the output current 122 that is a weighted average of the currents 216, 218 is explained in further detail below. In some embodiments, the first and second voltages 104, 106 can be ensured to operate in the linear region by choosing proper device dimensions (e.g., W/L) to match the current that is intended to flow through them. This is done at a design stage with circuit simulation tools, in some embodiments.

In some embodiments, the fifth transistor 234 has same or similar dimensions as the fourth transistor 230. For example, the fifth transistor 234 has a same or similar W/L ratio as the fourth transistor 230 in embodiments, where W is transistor width and L is the transistor's channel length. Likewise, in embodiments, the transistor 236 has same or similar dimensions as the transistor 232. It is noted that the circuit of FIG. 2 is not limited to the particular transistors and transistor types illustrated in the figure. For example, although the illustration of FIG. 2 depicts NMOS transistors 224, 226, 228 and PMOS transistors 230, 232, 234, 236, in other examples, one or more NMOS transistors are replaced with PMOS transistors, and vice versa. Further, in other examples, one or more of the MOSFET transistors 224, 226, 228, 230, 232, 234, 236 are replaced with transistors of another type (e.g., bipolar junction transistors, etc.).

As described above, a voltage at the gate terminal of the fourth transistor 230 is the first voltage 104, and a voltage at the gate terminal of the fifth transistor 234 is the second voltage 106. The averaging circuit 116 receives the first and second voltages 104, 106 at a buffer circuit 210. As illustrated in the figure, the buffer circuit 210 comprises (i) a first differential amplifier 206 that receives the first voltage 104, and (ii) a second differential amplifier 208 that receives the second voltage 106. Due to the cascode operation of devices 232 and 236, at the instant the switches 212 and 214 open and close, charge-injection (e.g., residual charge thrown back to the input of the switch) can alter the voltage at the nodes connected to it. The buffer circuit 210 isolates the drains of the transistors 226, 228, 232, 236 from these transients, which can disturb the current accuracy of the transistors 226, 228, 230, 234. The first and second differential amplifiers 206, 208 comprise operational amplifiers, in examples. An output of the first differential amplifier 206 feeds back into one of its inputs, and likewise, an output of the second differential amplifier 208 feeds back into one of its inputs, as shown in the figure.

In embodiments, a voltage at an output terminal of the first differential amplifier 206 is equal to (or substantially equal to) the first voltage 104, and the output terminal of the first differential amplifier 206 is coupled to a first switch 212. Likewise, a voltage at an output terminal of the second differential amplifier 208 is equal to (or substantially equal to) the second voltage 106, and the output terminal of the second differential amplifier 208 is coupled to a second switch 214. The first and second switches 212, 214 form a coupling circuit that is responsive to pulse width modulation signals 110A, 110B received from the digital circuit 108. The coupling circuit is configured to (i) couple the first voltage 104 to a node 250 when the pulse width modulation signal 110A has a first logic level (e.g., a logic level high voltage level), and (ii) couple the second voltage 106 to the node 250 when the pulse width modulation signal 110A has a second logic level (e.g., a logic level low voltage level).

More specifically, in the coupling circuit formed by the first and second switches 212, 214, the first switch 212 is configured to receive the first pulse width modulation signal 110A from the digital circuit 108. The first switch 212 (i) couples the first voltage 104 to the node 250 when the first pulse width modulation signal 110A has the first logic level (e.g., high), and (ii) decouples the first voltage 104 from the node 250 when the first pulse width modulation signal 110A has the second logic level (e.g., low). Likewise, the second switch 214 is configured to receive the second pulse width modulation signal 110B from the digital circuit 108. The pulse width modulation signal 110B is an inverted version of the pulse width modulation signal 110A, such that when the pulse width modulation signal 110A is high, the pulse width modulation signal 110B is low, and vice versa. The second switch 214 (i) couples the second voltage 106 to the node 250 when the second pulse width modulation signal 110B has the first logic level (e.g., high), and (ii) decouples the second voltage 106 from the node 250 when the second pulse width modulation signal 110B has the second logic level (e.g., low).

It is noted that the coupling circuit formed by the first and second switches 212, 214 couples only one of the first and second voltages 104, 106 to the node 250 at any given time. In embodiments, for instance, when the first pulse width modulation signal 110A is high, the first switch 212 is closed, and the first voltage 104 is coupled to the node 250. At the same time, the pulse width modulation signal 110B is low, such that the switch 214 is open, and the second voltage 106 is not coupled to the node 250.

Duty cycles of the respective first and second pulse width modulation signals 110A, 110B are controllable based on the bits of configuration data 112 received by the digital circuit 108. The digital circuit 108 also receives the digital clock signal 114, as illustrated in FIG. 2. In examples, the digital circuit 108 comprises a digital state machine that is responsive to edges in the digital clock signal 114. In some embodiments, the digital state machine is responsive to only rising edges of the digital clock signal 114 or only falling edges of the digital clock signal 114. In other embodiments, the digital state machine is responsive to both rising and falling edges of the digital clock signal 114.

The digital state machine 108 is configured to (i) maintain a count value between a predetermined minimum value and a predetermined maximum value, with the count value being incremented in response to edges of the digital clock signal 114, (ii) assert the pulse width modulation signal 110A having a first logic level (e.g., a logic level high voltage level) when the count value is within a first range of count values, and (iii) assert the pulse width modulation signal 110A having a second logic level (e.g., a logic level low voltage level) when the count value is within a second range of count values. The first and second ranges are based on the bits of configuration data 112 received by the digital circuit 108. The digital state machine 108 is likewise configured to assert the pulse width modulation signal 110B having the first logic level when the count value is within the second range of count values and assert the pulse width modulation signal 110B having the second logic level when the count value is within the first range of count values.

Figure 3A:
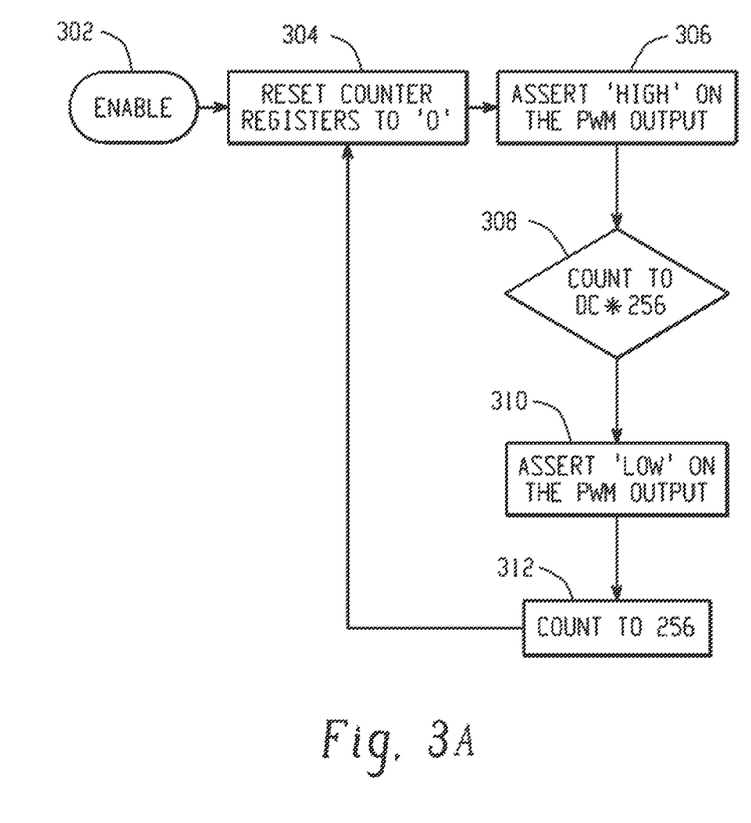
FIG. 3A is a flowchart depicting example operations performed by the digital state machine of FIGS. 1A and 2, according to an embodiment.

To further illustrate the operation of the digital circuit 108, reference is made to FIG. 3A. This figure is a flowchart depicting example operations performed by the digital circuit 108, according to an embodiment. At a step 302, the digital circuit 108 is enabled. In embodiments, a control signal "Enable" starts the operation of the circuit. The controller of the chip signals that all power supplies are up and running, and that Iref (202) is available. At a step 304, a count value maintained by the digital stage machine (e.g., in registers or another storage device) is set to zero. At a step 306, the digital circuit 108 asserts the pulse width modulation signal 110A having a logic level high voltage value. The digital circuit 108 also asserts the pulse width modulation signal 110B having a logic level low voltage value at the step 306, such that the pulse width modulation signal 110B is an inverted version of the pulse width modulation signal 110A.

At a step 308, the digital circuit 108 increments the count value from the starting value of zero to a value (DC*256), with the count value being incremented (e.g., in steps of "1") in response to edges of the digital clock signal 114. In embodiments, the digital circuit 108 increments the count value in response to positive edges of the digital clock signal 114, negative edges of the digital clock signal 114, or both positive and negative edges of the digital clock signal 114. The digital circuit 108 continues to assert the pulse width modulation signal 110A having the logic level high voltage value during the counting from zero to the value (DC*256). The digital circuit 108 also continues to assert the pulse width modulation signal 110B having the logic level low voltage value during the counting from zero to the value (DC*256). The variable DC represents the duty cycle of the pulse width modulation signal 110A and has a value between 0 and 1.0.

In examples, the digital circuit 108 processes the received bits of configuration data 112 to determine the variable DC and thus set the duty cycle of the pulse width modulation signal 110A. For instance, in examples where the eight bits of configuration data are utilized, for bits of configuration data 112 having a binary value of "00000100," the digital circuit 108 sets the variable DC to 0.0157, which equates to the duty cycle of 1.57%. The duty cycle of 1.57% corresponding to the bits of configuration data "00000100" is shown in the third column 156 of the table of FIG. 1C. When the variable DC is equal to 0.0157, the digital circuit 108 increments the count value from the starting value of 0 to the value 4 (i.e., DC*256, where DC=0.0157) in the step 308. Likewise, for instance, for bits of configuration data 112 having a binary value of "01111111," the digital circuit 108 sets the variable DC to 0.50, which equates to the duty cycle of 50%. When the variable DC is equal to 0.50, the digital circuit 108 increments the count value from the starting value of 0 to the value 128 (i.e., DC*256, where DC=0.50) in the step 308.

At a step 310, after the digital circuit 108 has incremented the count value from the starting value of zero to the value (DC*256), the digital circuit 108 asserts the pulse width modulation signal 110A having the logic level low voltage value. Thus, after counting to the value (DC*256), the digital circuit 108 switches the PWM output from high to low. The digital circuit 108 also asserts the pulse width modulation signal 110B having the logic level high voltage value at the step 310, such that the pulse width modulation signal 110B continues to be an inverted version of the pulse width modulation signal 110A. At a step 312, the digital circuit 108 increments the count value (e.g., in steps of "1") from the value (DC*256) to a value 256 in response to edges of the digital clock signal 114. The digital circuit 108 continues to assert the pulse width modulation signal 110A having the logic level low voltage value during the counting from the value (DC*256) to the value 256. The digital circuit 108 also continues to assert the pulse width modulation signal 110B having the logic level high value during the counting from the value (DC*256) to the value 256. When the count value 256 is reached, the process returns to the step 304, and the count value is reset to zero.

From the description above, it can be seen that the pulse width modulation signal 110A is (i) high when the digital circuit 108 is counting from 0 to (DC*256), and (ii) low when the digital circuit 108 is counting from (DC*256) to 256. This causes the pulse width modulation signal 110A to have a duty cycle that corresponds to the value DC, which is set based on the bits of configuration data 12. Likewise, the pulse width modulation signal 110B is (i) low when the digital circuit 108 is counting from 0 to (DC*256), and (ii) high when the digital circuit 108 is counting from (DC*256) to 256. This causes the pulse width modulation signal 110B to be an inverted version of the pulse width modulation signal 110A.

With reference again to FIG. 2, the circuit includes a low-pass filter 204 including an input node and an output node 252. The input node of the low-pass filter 204 is the aforementioned node 250. As described above, the coupling circuit formed from the switches 212, 214 (i) couples the first voltage 104 to the node 250 when the pulse width modulation signal 110A has the first logic level (e.g., high), and (ii) couples the second voltage 106 to the node 250 when the pulse width modulation signal 110A has the second logic level (e.g., low). The low-pass filter 204 includes a resistor R coupled between the input node 250 and the output node 252. The low-pass filter 204 further includes a capacitor C coupled between the output node 252 and a ground reference voltage. The resistor R and capacitor C form a resistor-capacitor (RC) circuit.

As described above, the voltage at the input node 250 of the low-pass filter 204 alternates been the first voltage 104 and the second voltage 106 based on the duty cycle of the pulse width modulation signals 110A, 110B. Based on the alternating voltages at the input node 250 of the low-pass filter 204, a voltage at the output node 252 of the low-pass filter 204 is a weighted average of the first and second voltages 104, 106, with the weights of the respective first and second voltages 104, 106 being based on the duty cycle of the pulse width modulation signals 110A, 110B. Thus, for example, if the first voltage 104 is equal to 0.55 V and the second voltage 106 is equal to 0.83 V, and the duty cycle is 50%, then the voltage at the output node 252 is equal to 0.69 V. In embodiments, the voltage at the output node 252 of the low-pass filter 204 is represented by Equation 1 above.

The capacitor C of the low-pass filter 204 is a reactive device, and so it offers differing resistance to signals of different frequencies entering through it. Specifically, the capacitor C is a reactive device which offers (i) very high resistance to low-frequency, or DC, signals, and (ii) low resistance to high-frequency signals. As the capacitor C offers very high resistance to DC signals, in the circuit of FIG. 2, the capacitor C blocks DC signals from entering and passes them off to the gate terminal of the transistor 240. High frequency signals will go through the capacitor C, since the capacitor C offers such signals a very low-resistance path. Current always takes the path of least resistance, and being that a capacitor represents a low resistance in a circuit for high-frequency signals, such high-frequency signals will take the path through the capacitor C, while low-frequency signals will take an alternative, lower-resistance path.

Figure 3B:
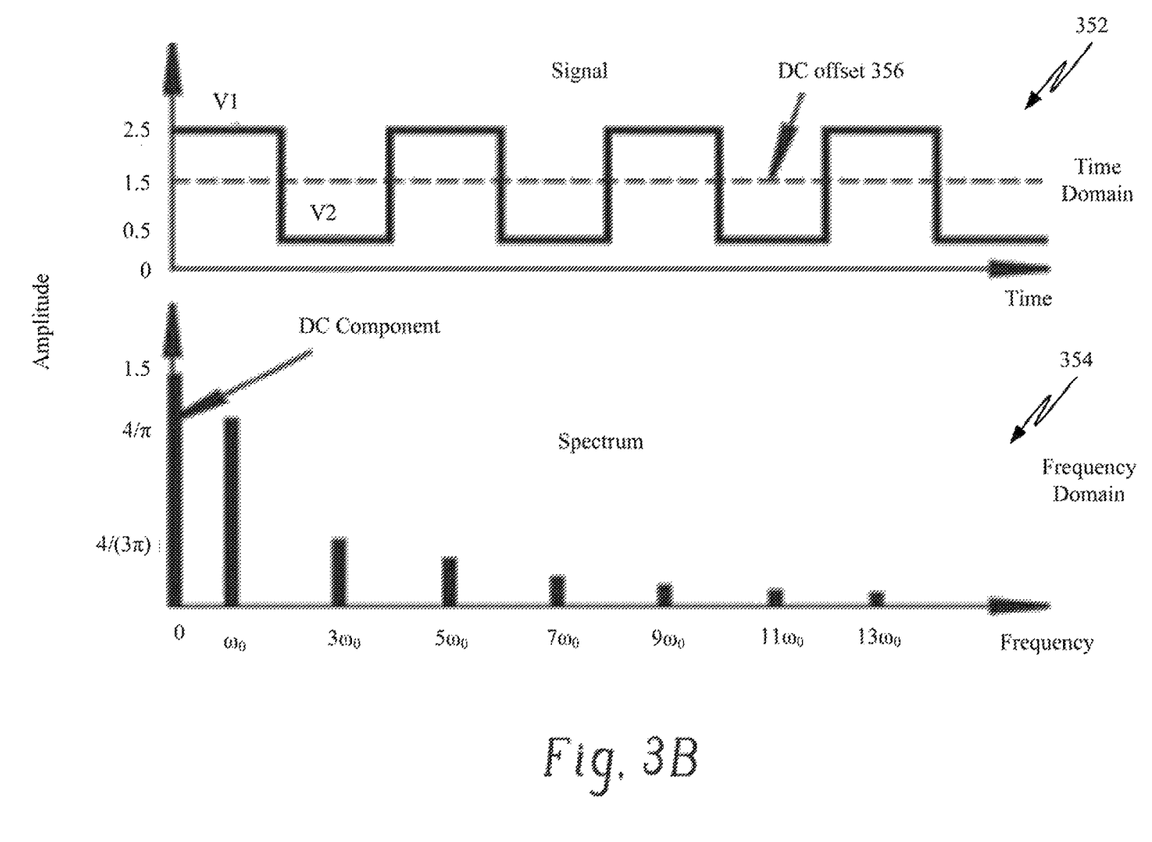
FIG. 3B depicts graphs showing a voltage signal at a node of a circuit in the time domain and the frequency domain, according to an embodiment.

To further illustrate the operation of the low-pass filter 204, reference is made to FIG. 3B. A voltage at the node 250 is shown in a graph 352 in the time domain. As can be seen in the graph 352, the voltage at the node 250 toggles between the first voltage 104 ("V1," as illustrated in FIG. 3B) and the second voltage 106 ("V2"). The average of the voltage at the node 250 in the time domain is the DC offset 356. In the example of FIG. 3B, the duty cycle is 50%, and so the average of the voltage at the node 250 is ((V1+V2)/2). In the bottom graph 354, the same signal is presented in the frequency-domain. Its DC component (e.g., the desired quantity at frequency=0 Hz) is equal to the time average of the signal. By placing the cutoff frequency of the low-pass filter 204 in a frequency obeying $0<\omega<\omega_0$, only the DC component is left at the output of the low-pass filter 204.

With reference again to FIG. 2, the voltage at the output node 252 of the low-pass filter 204 is the bias voltage 118 received at the voltage-controlled current source 120. In the example of FIG. 2, the voltage-controlled current source 120 comprises a transistor 240 that receives the bias voltage 118 at its gate terminal. A current flow between source and drain terminals of the transistor 240 is the output current 122, which is based on the bias voltage 118 at the gate terminal. In the example of FIG. 2, the transistor 240 is a PMOS transistor, and an example current-voltage relationship of the transistor 240 is shown in FIG. 1B. In FIG. 1B, the y-axis represents a drain current of the transistor 240, and the x-axis represents a bias voltage received by the transistor 240. As shown in this figure, the current-voltage relationship of the transistor 240 has a linear region, over which there is a generally linear relationship between the output current and the received bias voltage.

As described above, the first and second voltages 104, 106 are within the linear region of the curve, such that the bias voltage 118 is also within the linear region, given the relationship (first voltage 104)≤(bias voltage 118)≤(second voltage 106). Because the bias voltage 118 is within the linear region, the output current 122 generated based on the bias voltage 118 comprises a weighted average of the first and second currents 216, 218, where weights of the respective first and second currents 216, 218 are based on the duty cycle of the pulse width modulation signal 110A. In embodiments, the output current 122 generated by the transistor 240 is represented by the following:

$$I\_out=(DC)(I2)+(1-DC)(I1), \quad \text{(Equation 2)}$$

where I_out is the output current 122, I2 is the second current 218, I1 is the first current 216, and DC represents the duty cycle of the pulse width modulation signal 110A, having a value between 0 (i.e., 0% duty cycle) and 1.0 (i.e., 100% duty cycle). In Equation 2, the terms (DC) and (1−DC) are weights for the respective second current 218 and first current 216.

As shown in FIG. 2, the output current 122 is received at a load 222. Additionally, the voltage-controlled current source 120 includes a transistor 242 (e.g., a PMOS transistor) through which the output current 122 flows. The transistor 242 receives the cascode bias that is also received by the transistors 232, 236.

Although embodiments described herein utilize a voltage generator that generates first and second voltages (e.g., first and second voltages 104, 106) and an averaging circuit that generates a bias voltage based on a weighted average of the first and second voltages, the techniques of the instant disclosure are not limited to these particular embodiments. More broadly, according to the techniques of the instant disclosure, a voltage generator circuit generates at least two voltages. A digital circuit is configured to generate a pulse width modulation signal having a waveform characteristic (e.g., a duty cycle) that is controllable based on bits of configuration data received by the digital circuit. An averaging circuit is configured to receive the pulse width modulation signal and generate a bias voltage that comprises a weighted average of the at least two voltages. Weights of the at least two voltages are based on the waveform characteristic of the pulse width modulation signal. A voltage-controlled current source is configured to generate an output current based on the bias voltage. It is thus noted that the techniques of the instant disclosure are not limited to embodiments described herein using only first and second voltages, and that in embodiments, a number of voltages that is greater than two is used in generating the output current.

Figure 4:
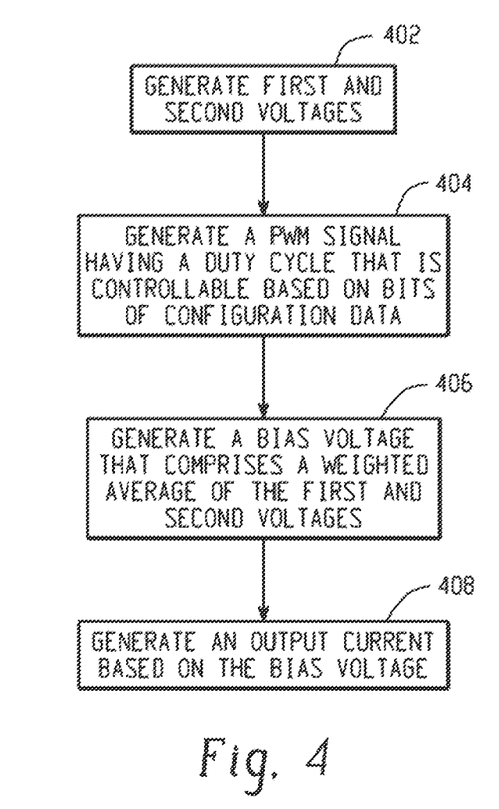
FIG. 4 is a flowchart depicting operations of an example method for generating an output current, according to an embodiment.

FIG. 4 is a flowchart depicting operations of an example method for generating an output current, according to an embodiment. FIG. 4 is described with reference to FIGS. 1 and 2 above for ease of understanding. But the process of FIG. 4 is applicable to other circuits as well. At 402, a first voltage (e.g., first voltage 104) and a second voltage (e.g., second voltage 106) are generated. At 404, a pulse width modulation signal (e.g., pulse width modulation signal 110) having a duty cycle that is controllable based on bits of configuration data (e.g., bits of configuration data 112) is generated. At 406, a bias voltage (e.g., bias voltage 118) that comprises a weighted average of the first and second voltages is generated, where weights of the respective first and second voltages are based on the duty cycle of the pulse width modulation signal. At 408, an output current (e.g., output current 122) based on the bias voltage is generated using a voltage-controlled current source (e.g., voltage-controlled current source 120). The output current has a generally linear relationship with the bias voltage for bias voltages between the first voltage and the second voltage.

This application uses examples to illustrate the invention. The patentable scope of the invention may include other examples.

What is claimed is:
1. A circuit for generating an output current, the circuit comprising:
   a voltage generator circuit configured to generate at least two voltages;
   a digital circuit configured to generate a pulse width modulation signal having a waveform characteristic that is controllable based on bits of configuration data received by the digital circuit;
   an averaging circuit configured to (i) receive the pulse width modulation signal, and (ii) generate a bias voltage that comprises a weighted average of the at least two voltages, weights of the at least two voltages being based on the waveform characteristic of the pulse width modulation signal; and
   a voltage-controlled current source configured to generate an output current based on the bias voltage.

2. The circuit of claim 1, wherein the at least two voltages comprise a first voltage and a second voltage, and wherein the output current has a generally linear relationship with the bias voltage for bias voltages between the first voltage and the second voltage.

3. The circuit of claim 1, wherein the waveform characteristic is a duty cycle.

4. The circuit of claim 1, further comprising a constant current source configured to generate a reference current, wherein the voltage generator circuit comprises:
   a first transistor configured to draw the reference current from the constant current source;
   a second transistor configured to draw a first current equal to the reference current multiplied by a first multiplicative factor, the first and second transistors being connected to form a first current mirror; and
   a third transistor configured to draw a second current equal to the reference current multiplied by a second multiplicative factor that is different from the first multiplicative factor, the first and third transistors being connected to form a second current mirror, wherein a first voltage of the at least two voltages is based on the first current, and a second voltage of the at least two voltages is based on the second current.

5. The circuit of claim 4, wherein the output current comprises a weighted average of the first and second currents, weights of the respective first and second currents being based on the waveform characteristic of the pulse width modulation signal.

6. The circuit of claim 4, wherein the voltage generator circuit further comprises:
a fourth transistor coupled to the second transistor and configured to draw the first current, wherein a voltage at a gate terminal of the fourth transistor is based on the first current and comprises the first voltage; and
a fifth transistor coupled to the third transistor and configured to draw the second current, wherein a voltage at a gate terminal of the fifth transistor is based on the second current and comprises the second voltage.

7. The circuit of claim 1, wherein the averaging circuit is configured to receive the at least two voltages, the averaging circuit comprising:
a low-pass filter comprising an input node and an output node; and
a coupling circuit that is responsive to the pulse width modulation signal, the coupling circuit being configured to (i) couple a first voltage of the at least two voltages to the input node when the pulse width modulation signal has a first logic level, and (ii) couple a second voltage of the at least two voltages to the input node when the pulse width modulation signal has a second logic level that is different from the first logic level, wherein a voltage at the output node of the low-pass filter comprises the bias voltage.

8. The circuit of claim 7, wherein the coupling circuit comprises:
a first switch configured to receive the first voltage, wherein the first switch (i) couples the first voltage to the input node when the pulse width modulation has the first logic level, and (ii) decouples the first voltage from the input node when the pulse width modulation signal has the second logic level; and
a second switch configured to receive the second voltage, wherein the second switch (i) couples the second voltage to the input node when the pulse width modulation has the second logic level, and (ii) decouples the second voltage from the input node when the pulse width modulation signal has the first logic level.

9. The circuit of claim 7, wherein the low-pass filter comprises:
a resistor coupled between the input node and the output node; and
a capacitor coupled between the output node and a ground reference voltage, wherein the resistor and capacitor form a resistor-capacitor (RC) circuit having a cutoff frequency, the RC circuit blocking frequency components above the cutoff frequency.

10. The circuit of claim 1, wherein the digital circuit receives a digital clock signal, the digital circuit comprising:
a digital state machine responsive to edges in the digital clock signal, the digital state machine being configured to (i) maintain a count value between a predetermined minimum value and a predetermined maximum value, the count value being incremented in response to edges of the digital clock signal, (ii) assert the pulse width modulation signal having a first logic level when the count value is within a first range of count values, and (iii) assert the pulse width modulation signal having a second logic level when the count value is within a second range of count values, the first and second ranges being based on the bits of configuration data.

11. The circuit of claim 1, wherein the voltage-controlled current source comprises:
a transistor that receives the bias voltage at a gate terminal, a current flow between source and drain terminals of the transistor being equal to the output current.

12. A circuit for generating an output current, the circuit comprising:
a voltage generator circuit configured to generate at least two voltages;
a pulse width modulation circuit configured to generate a pulse width modulation signal having a waveform characteristic that is controllable based on bits of configuration data;
an averaging circuit configured to generate a bias voltage that comprises a weighted average of the at least two voltages, weights of the at least two voltages being based on the waveform characteristic of the pulse width modulation signal; and
a current source configured to generate an output current based on the bias voltage.

13. The circuit of claim 12, wherein the pulse width modulation circuit comprises:
an interface for receiving the bits of configuration data from a device that is coupled to the pulse width modulation circuit; and
a storage device for storing the bits of configuration data.

14. The circuit of claim 12, further comprising a second current source configured to generate a reference current, wherein the voltage generator circuit comprises:
a first transistor configured to draw the reference current from the second current source;
a second transistor configured to draw a first current equal to the reference current multiplied by a first multiplicative factor, the first and second transistors being connected to form a first current mirror; and
a third transistor configured to draw a second current equal to the reference current multiplied by a second multiplicative factor that is different from the first multiplicative factor, the first and third transistors being connected to form a second current mirror, wherein a first voltage of the at least two voltages is based on the first current, and a second voltage of the at least two voltages is based on the second current.

15. The circuit of claim 14, wherein the voltage generator circuit further comprises:
a fourth transistor coupled to the second transistor and configured to draw the first current, wherein a voltage at a gate terminal of the fourth transistor is based on the first current and comprises the first voltage; and
a fifth transistor coupled to the third transistor and configured to draw the second current, wherein a voltage at a gate terminal of the fifth transistor is based on the second current and comprises the second voltage.

16. The circuit of claim 12, wherein the averaging circuit is configured to receive the at least two, the averaging circuit comprising:
a low-pass filter comprising an input node and an output node; and
a coupling circuit that is responsive to the pulse width modulation signal, the coupling circuit being configured to (i) couple a first voltage of the at least two voltages to the input node when the pulse width modulation signal has a first logic level, and (ii) couple a second voltage of the at least two voltages to the input node when the pulse width modulation signal has a second logic level that is different from the first logic level, wherein a voltage at the output node of the low-pass filter comprises the bias voltage.

17. The circuit of claim 16, wherein the low-pass filter comprises:
a resistor coupled between the input node and the output node; and
a capacitor coupled between the output node and a ground reference voltage, wherein the resistor and capacitor form a resistor-capacitor (RC) circuit having a cutoff frequency, the RC circuit blocking frequency components above the cutoff frequency.

18. The circuit of claim 12, wherein the pulse width modulation circuit receives a digital clock signal, the pulse width modulation circuit comprising:
a digital state machine responsive to edges in the digital clock signal, the digital state machine being configured to (i) maintain a count value between a predetermined minimum value and a predetermined maximum value, the count value being incremented in response to edges of the digital clock signal, (ii) assert the pulse width modulation signal having a first logic level when the count value is within a first range of count values, and (iii) assert the pulse width modulation signal having a second logic level when the count value is within a second range of count values, the first and second ranges being based on the bits of configuration data.

19. A method of generating an output current, the method comprising:
generating at least two voltages;
generating a pulse width modulation signal having a waveform characteristic that is controllable based on bits of configuration data;
generating a bias voltage that comprises a weighted average of the at least two voltages, weights of the at least two voltages being based on the waveform characteristic of the pulse width modulation signal; and
generating an output current based on the bias voltage using a voltage-controlled current source.

20. The method of claim 19, further comprising:
generating a reference current using a constant current source;
using a first current mirror to generate a first current equal to the reference current multiplied by a first multiplicative factor; and
using a second current mirror to generate a second current equal to the reference current multiplied by a second multiplicative factor that is different from the first multiplicative factor, wherein a first voltage of the at least two voltages is based on the first current, and a second voltage of the at least two voltages is based on the second current.

* * * * *